US009680095B2

(12) United States Patent
Chen et al.

(10) Patent No.: US 9,680,095 B2
(45) Date of Patent: Jun. 13, 2017

(54) RESISTIVE RAM AND FABRICATION METHOD

(71) Applicant: Macronix International Co., Ltd., Hsinchu (TW)

(72) Inventors: I Yueh Chen, Hsinchu (TW); Wei-Chih Chien, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 13/931,512

(22) Filed: Jun. 28, 2013

(65) Prior Publication Data

US 2014/0264237 A1    Sep. 18, 2014

Related U.S. Application Data

(60) Provisional application No. 61/778,507, filed on Mar. 13, 2013.

(51) Int. Cl.
*H01L 45/00* (2006.01)

(52) U.S. Cl.
CPC ............ *H01L 45/146* (2013.01); *H01L 45/04* (2013.01); *H01L 45/1233* (2013.01); *H01L 45/145* (2013.01); *H01L 45/1633* (2013.01)

(58) Field of Classification Search
CPC ............ G11C 13/0069; G11C 13/0004; G11C 13/0007
USPC .............................................. 257/4; 365/148
See application file for complete search history.

(56) References Cited

U.S. PATENT DOCUMENTS

| 4,729,815 | A | 3/1988 | Leung |
| 6,037,268 | A | 3/2000 | Dautartas et al. |
| 7,943,920 | B2 | 5/2011 | Chien et al. |
| 2005/0247921 | A1* | 11/2005 | Lee et al. .......................... 257/2 |
| 2006/0166476 | A1* | 7/2006 | Lee ...................... C23C 14/5826 438/591 |
| 2010/0258778 | A1* | 10/2010 | Sung ....................... H01L 45/08 257/2 |
| 2010/0308298 | A1* | 12/2010 | Ninomiya et al. ................ 257/5 |
| 2011/0002155 | A1* | 1/2011 | Arita et al. .................... 365/148 |
| 2011/0140069 | A1* | 6/2011 | Inoue .................... H01L 45/145 257/5 |

(Continued)

FOREIGN PATENT DOCUMENTS

| CN | 101878530 A | 11/2010 |
| CN | 102867911 A | 1/2013 |

(Continued)

OTHER PUBLICATIONS

Office Action in related Case U.S. Appl. No. 14/723,315 dated Sep. 20, 2016, 15 pages.

(Continued)

*Primary Examiner* — Cuong Q Nguyen
*Assistant Examiner* — Nishath Yasmeen
(74) *Attorney, Agent, or Firm* — Haynes Beffel & Wolfeld LLP

(57) ABSTRACT

A structure for a resistive memory device and a method to fabricate the same is disclosed. The method includes providing a bottom electrode comprising a metal and forming a memory layer on the bottom electrode. The memory layer includes a first layer of metal oxide, and a second layer including the nitrogen-containing metal oxide. A top electrode is formed over the memory layer.

20 Claims, 9 Drawing Sheets

(56) References Cited

U.S. PATENT DOCUMENTS

| | | | |
|---|---|---|---|
| 2012/0104350 A1 | 5/2012 | Himeno et al. | |
| 2012/0280199 A1* | 11/2012 | Takagi | H01L 27/101 |
| | | | 257/3 |
| 2012/0292588 A1* | 11/2012 | Fujii | H01L 45/145 |
| | | | 257/4 |
| 2013/0082230 A1 | 4/2013 | Katayama et al. | |
| 2013/0178042 A1 | 7/2013 | Ninomiya et al. | |

FOREIGN PATENT DOCUMENTS

| | | | |
|---|---|---|---|
| WO | WO2011064967 | * | 6/2011 |
| WO | WO2012081248 | * | 6/2012 |

OTHER PUBLICATIONS

Baik, I.G., "Highly Scalable Non-volatile Resistive Memory using Simple Binary Oxide Driven by Asymmetric Unipolar Voltage Pulses," IEEE IEDM 2004 4 pages.
Chen, An, et al., "Non-Volatile Resistive Switching for Advanced Memory Applications," IEEE (2005) 4 pages.
Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

* cited by examiner

RESISTIVE RAM AND FABRICATION METHOD

This application claims benefit of U.S. Provisional Patent Application No. 61/778,507 filed on 13 Mar. 2013, which application is incorporated by reference as if fully set forth herein.

BACKGROUND

The present invention relates to memory devices. In particular, the present invention relates to methods for manufacturing and structures for programmable resistance memory devices that include a metal oxide.

Resistive RAM (RRAM) is emerging technology for non-volatile memory devices. Some RRAM technologies are characterized by simple cell structures that are scalable, and suitable for use in 3D arrays.

Some RRAM technologies are based on metal oxide memory materials, typically transition metal oxides, which can be caused to change resistance between two or more stable ranges by application of electrical pulses at levels suitable for implementation in integrated circuits, and the resistance can be read and written with random access to indicate stored data.

NiO, $TiO_2$, $HfO_2$, and $ZrO_2$ based RRAM have been investigated for use as memory material in memory cells. See, Baek, et al., "Highly Scalable Non-Volatile Resistive Memory using Simple Binary Oxide Driven by Asymmetric Unipolar Voltage Pulses," IEDM Technical Digest pp. 23.6.1-23.6.4, IEEE International Electron Devices Meeting 2004. These memory cells are formed by a non-self-aligned process in an M-I-M structure, where M is a noble metal acting as an electrode and "I" is one of NiO, $TiO_2$, $HfO_2$, and $ZrO_2$. This MIM structure requires several additional masks and patterning to form the noble metal electrodes and the memory material, and results in a relatively large memory cell size.

$Cu_xO$ based RRAM has also been investigated for use as a memory material in memory cells. See, Chen et al., "Non-Volatile Resistive Switching for Advanced Memory Applications," IEDM Technical Digest pp. 746-749, IEEE International Electron Devices Meeting 2005. The $Cu_xO$ material is formed by thermal oxidation of a copper via which acts as the bottom electrode for the memory cell, while the top electrode consists of a bi-layer Ti/TiN film that is deposited and etched. This structure requires several additional masks to form the top and bottom electrodes, and results in a relatively large memory cell size. Chen et al. disclose that having a copper bottom electrode complicates erasing of the memory cell since the applied field during erasing may push copper ions into the $Cu_xO$. Additionally, $Cu_xO$ has a relatively small resistance window of 10x.

Cu—$WO_3$ based RRAM has also been investigated for use as a memory material in programmable metallization memory cells. See, Kozicki et al., "A Low-Power Nonvolatile Switching Element Based on Copper-Tungsten Oxide Solid Electrolyte," IEEE Transactions on Nanotechnology pp. 535-544, Vol. 5, No. 5, September 2006. Switching elements fabricated using tungsten metal, a solid electrolyte based on tungsten-oxide and photo-diffused copper, and a copper top electrode are disclosed. The switching element is formed by tungsten-oxide grown or deposited on tungsten material, a layer of Cu formed on the tungsten-oxide and the Cu photo-diffused into the tungsten-oxide to form the solid electrolyte, and a Cu layer is formed and patterned over the solid electrolyte to act as a top electrode. The switching element changes resistance by applying a bias voltage to cause electro-deposition of Cu ions from the top electrode into the solid electrolyte, and states that "a lack of Cu in the top electrode results in no measurable switching activity" (see page 539, column 1). This structure thus needs a Cu top electrode, involves several process steps to form the solid electrolyte, and necessitates bias voltages of opposite polarities to cause the injection of Cu ions to program and erase the solid electrolyte.

RRAM based on tungsten oxide memory material is particularly appealing as tungsten is commonly used as a conductor material in device fabrication. See for example, U.S. Pat. No. 7,943,920, entitled RESISTIVE MEMORY STRUCTURE WITH BUFFER LAYER, issued on 17 May 2011.

SUMMARY

A method of forming a memory device including a nitrogen-containing metal oxide is described. An example of the method includes providing a bottom electrode, forming a memory layer on the bottom electrode including a nitrogen-containing metal oxide, and forming a top electrode over the nitrogen-containing metal oxide. The bottom electrode comprises a transition metal, and the nitrogen-containing metal oxide comprises an oxynitride of the transition metal in illustrated embodiments. The memory layer can include a first layer of metal oxide, and a second layer including the nitrogen-containing metal oxide.

In another aspect, a memory device is provided, which comprises a bottom electrode, a memory layer on the bottom electrode including a nitrogen-containing metal oxide, and a top electrode over the nitrogen-containing metal oxide.

The memory device can include a bottom electrode, which comprises a metal. The memory layer can comprise a layer of metal oxide, which can be an oxide of the metal at a surface of the electrode and a layer of nitrogen-containing metal oxide over the metal oxide.

Other aspects and advantages of the technology are described with reference to the drawing in the detailed description and claims which follow.

DETAILED DESCRIPTION

Descriptions of a metal oxide memory cell and of methods for manufacturing the same are provided with reference to FIGS. 1-13. It is to be understood that there is no intention to limit the invention to the specifically disclosed embodiments but that the invention may be practiced using other features, elements, methods and embodiments.

Figure 1:
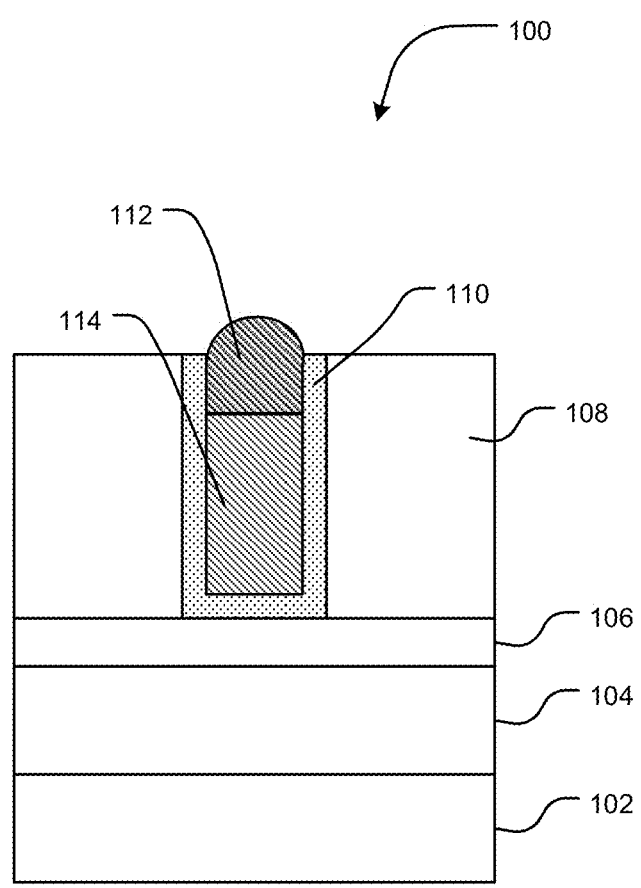
FIG. 1 is a simplified cross-sectional view of a resistive memory structure fabricated using a conventional method.

FIG. 1 is a cross-sectional view of a partially formed RRAM device 100 having a metal oxide memory material. RRAM device 100 includes a first electrode 114 configured in a plug structure lined by a diffusion barrier 110 in an insulator layer 108. First electrode 114 can include a transition metal, such as tungsten. Diffusion barrier layer 110 can be a conductive metal nitride, a metal material or a combination. RRAM device 100 includes a metal oxide memory material 112 over first electrode 114. RRAM device 100 is disposed over an insulator layer 104, separating it from the semiconductor substrate 102. A top electrode (not shown) is formed over at least the metal oxide memory material 112 to form a memory cell. Further shown is a first conductive line 106 electrically connected to first electrode 114 to connect the memory cell to controlling circuitry.

A conventional method of forming the metal oxide memory material 112 includes thermal oxidation of a first electrode surface. The thermal process can be rapid thermal oxidation (RTO) using oxygen as an oxidant gas. The metal oxide is preferably formed at a high temperature for a metal oxide of the highest oxidation state and a desirable resistance characteristic. Metal oxide formation is at least partly dependent on a diffusion of oxygen through the metal oxide initially formed. The resulting metal oxide layer can have a convex surface or a "hump" at the surface, as shown. Such surface topography may not be desirable for subsequent processes, for example, top electrode deposition, lithography, and others. Taking tungsten oxide as the memory material as an example, tungsten oxide exhibits different oxidation states $WO_x$, where x ranges from about 0.5 to 3. At low process temperature (for example, less than 500 degrees Celsius, the diffusion rate of oxygen through the metal oxide layer is low. As a result, a lower oxidation state ($WO_x$ where "x" is low, less than 3), or oxygen deficient $WO_x$, can be formed at the tungsten oxide/tungsten interface. These lower oxidation state tungsten oxides can result in leaky conductive paths at the tungsten oxide/tungsten interface. To address this problem of current leakage, a forming step can be used, in which a positive voltage is applied to the top electrode and oxygen is driven from tungsten oxide bulk to an interface between the top electrode and the tungsten oxide. The forming step can cause formation of a high resistance $WO_3$ at the interface. It is found that for tungsten oxide formed at low temperatures, a higher forming voltage is needed. Additionally, due to the leaky conductive paths in the metal oxide memory material, the set resistance to reset resistance ratio (or OFF state resistance to ON state resistance ratio) can be low, so that device performance is degraded.

Figure 2:
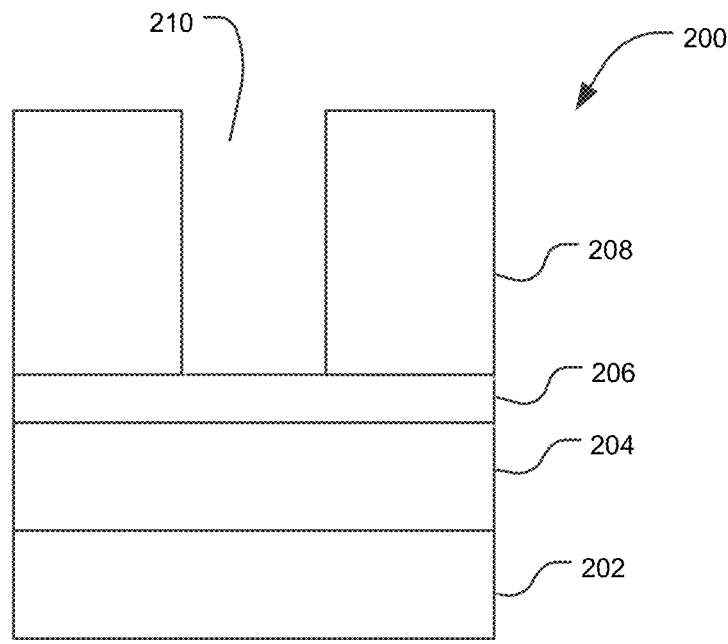
FIGS. 2-6 illustrate stages of a method of forming a resistive memory device.

FIGS. 2-6 illustrate stages of a method of forming an RRAM device having a metal oxide as memory material. As shown in FIG. 2, a partially formed memory device 200 includes a semiconductor substrate 202, which can be a single crystal silicon wafer, a silicon-on-insulator (SOI) substrate, a silicon germanium material, and other insulating materials.

An insulator layer 204 is formed overlying substrate 202 to insulate memory cells to be fabricated from substrate 202. Insulator layer 204 can be silicon oxide, silicon nitride, a dielectric stack with alternating layers of silicon oxide and silicon nitride (commonly known as ONO), a high K dielectric, a low K dielectric, and other insulating materials.

A first conductive line 206 is formed over insulator layer 204. First conductive line 206 can be formed, for example, using a metal material or a doped polysilicon material (p+ or n+). First conductive line 206 connects the memory cell to controlling circuitry in various implementations. A first insulator layer 208 is formed over first conductive line 206 and an opening 210 is formed in first insulator layer 208. Opening 210 extends through the first insulator layer 208 and exposes a surface of the conductive line 206. The first insulator layer 208 can be silicon oxide, silicon nitride, a dielectric stack with alternating layers of silicon oxide and silicon nitride (commonly known as ONO), a high K dielectric, a low K dielectric, and other insulating materials.

Figure 3:
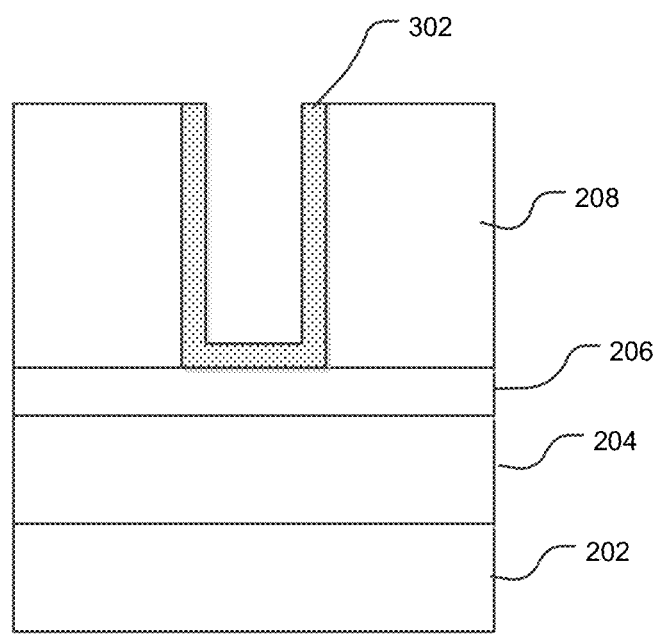

FIG. 3 illustrates the structure of FIG. 2 after forming a diffusion barrier layer 302 and possibly an adhesion layer lining the opening 210. Diffusion barrier layer 302 can be a conductive metal nitride including titanium nitride, tungsten nitride, tantalum nitride, titanium, and others. Diffusion barrier layers can also be a metal such as titanium. In certain embodiments, diffusion barrier layer 302 can include a conductive metal nitride over a metal. For example, for tungsten plugs, layer 302 can comprise titanium nitride over titanium.

Figure 4:
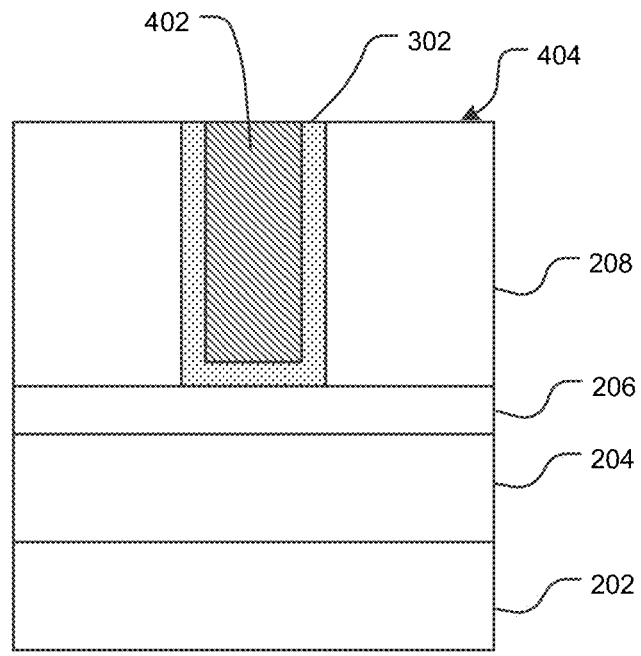

FIG. 4 illustrates a structure like that of FIG. 3 after depositing a metal material 402 to fill the lined opening 210 to provide a bottom electrode. The metal material can be a transition metal, where transition metals include Scandium, Titanium, Vanadium, Chromium, Manganese, Iron, Cobalt, Nickel, Copper, Zinc, Yttrium, Zirconium, Niobium, Molybdenum, Technetium, Ruthenium, Rhodium, Palladium, Silver, Cadmium, Hafnium, Tantalum, and Tungsten, among others.

The metal material 402 can be deposited using a physical vapor deposition process, a chemical vapor deposition process, or a combination of processes. Metal material 402 after deposition can have a thickness over a first insulator layer surface 404 and can be removed using a planarization process such as chemical mechanical polishing (CMP) or an etch back process. In some embodiments, the bottom electrode can comprise more than one material in the via. For the current process, the bottom electrode will have a metal surface.

Figure 5:
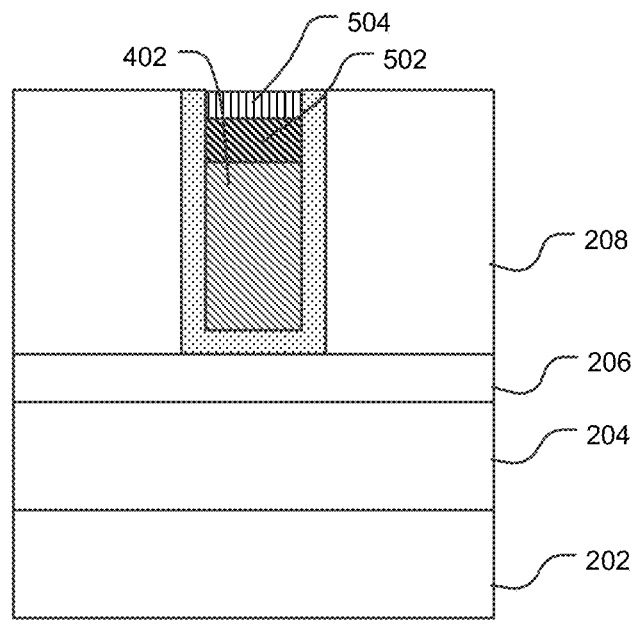

FIG. 5 illustrates a structure like that in FIG. 4 after metal oxide layer 502 is formed on the bottom electrode. The metal oxide layer 502 can be formed on the bottom electrode metal material 402 using an oxidation process, to oxidize the metal surface. The metal oxide layer 502 can be formed using a rapid thermal process, a rapid thermal oxidation (RTO) process in this case, using an oxidizing gas in a reaction chamber. The oxidizing gas can be oxygen in various embodiments. The RTO process includes first increasing the temperature at a ramp up rate to a desired hold temperature for a period of time. The RTO process forms a metal oxide layer 502 over the metal material 402. Taking tungsten as the metal as an example, the RTO process can be carried out at a temperature ramp rate of about 10 degrees per second and at a hold temperature ranging from about 470 degrees Celsius to about 800 degrees Celsius. In certain implementations, the hold temperature can range from about 470 degrees Celsius to about 480 degrees Celsius.

Next, a nitrogen-containing metal oxide layer 504 is formed on the metal oxide layer 502. The nitrogen-containing metal oxide layer can be formed, following the process described above for RTO formation of the metal oxide layer, without removing the wafer from the reaction chamber and maintaining the hold temperature, by introducing a mixture of reaction gases comprising nitrogen into the reaction chamber over metal oxide layer 502. The nitrogen-containing metal oxide can be an oxynitride compound, such as tungsten oxynitride. The mixture of reaction gases can comprise oxygen and nitrogen in various embodiments. In certain implementations, the oxygen flow rate can be the same in the RTO process used to form the metal oxide layer 502, as in the subsequent nitrogenation process used to form the nitrogen-containing metal oxide layer 504. Depending on the embodiment, the nitrogen flow rate for the nitrogenation process can be adjusted to achieve a memory material of desirable electrical characteristics. Again, taking tungsten as the metal electrode material as an example, the mixture of oxygen and nitrogen reaction gas can be provided at a ratio of oxygen flow rate to nitrogen flow rate of about 1:1 to about 8:1. The total reaction time, that is, time taken for the RTO process used to form the metal oxide layer 502, and in the subsequent nitrogenation process used to form the nitrogen containing metal oxide layer 504, can range from about 10 seconds to about 1000 seconds depending on a thicknesses of the metal oxide layer 502 and the nitrogen-containing metal oxide layer 504, and other factors related to the process environment. Depending on the implementation, the ratio of the time for the RTO process to the time of the nitrogenation process can be about 1:2 for example. Additionally, a reaction pressure ranging from about 100 torr to about 1000 torr can be used during the thermal processes for both the RTO and nitrogenation processes. In certain implementations, the reaction pressure can be about atmospheric pressure.

In some embodiments, only a nitrogen-containing metal oxide layer is used. Also, in some embodiments, the concentration of nitrogen in the metal oxide can vary though the thickness of the memory material.

Figure 6:
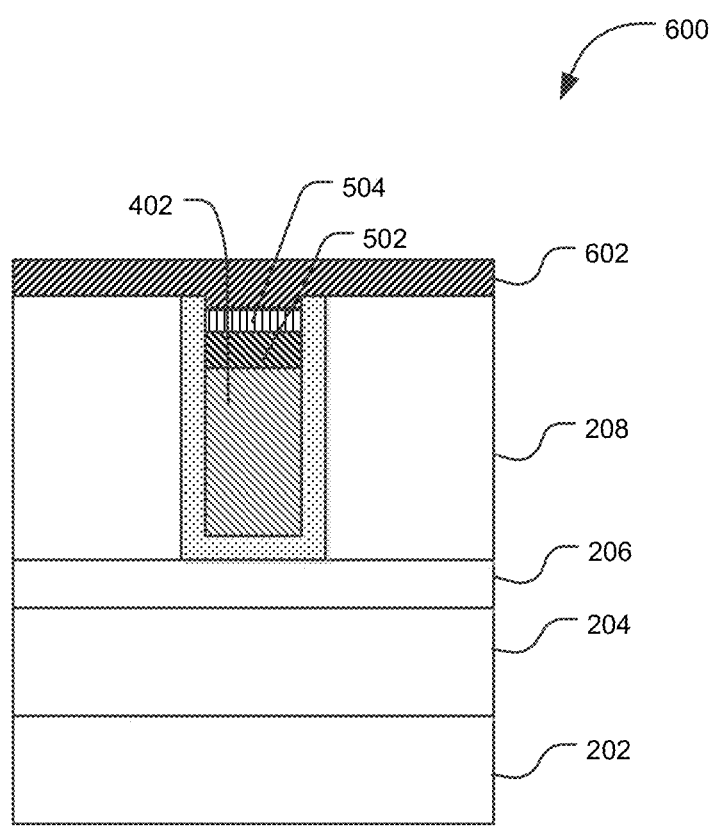

FIG. 6 illustrates a structure like that of FIG. 5 after forming a top electrode 602 over the nitrogenized metal oxide to form an RRAM cell 600. The top electrode can be formed by first depositing a diffusion barrier layer followed by a metal material. The diffusion barrier layer can be a conductive metal nitride or a metal or a combination. The diffusion barrier layer can include titanium nitride, tungsten nitride, tantalum nitride, titanium, and others. The diffusion barrier layer can also be a conductive metal nitride over a metal such as titanium nitride over titanium, and others. The metal material can be tungsten, copper, or aluminum, or other metal material depending on the implementation. In other implementations, a doped polysilicon (n+ type or p+ type) may be used for the top electrode, and a diffusion barrier layer may not be needed.

Figure 7:
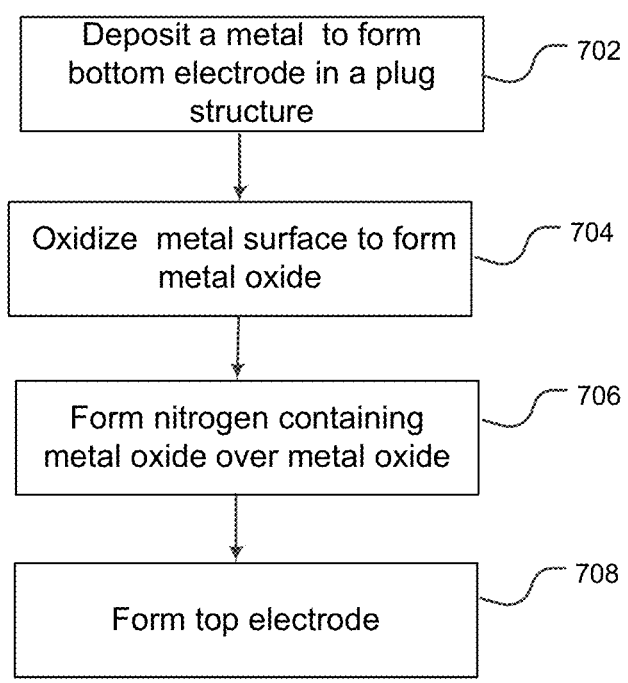
FIG. 7 illustrates a process flow of the method of forming the memory device.

FIG. 7 illustrates a process flow for the method of forming an RRAM device with a nitrogen-containing metal oxide over metal oxide as the memory material. The method includes the following steps:

Step 702: deposit a metal material in a lined opening in an insulating layer, the metal material can be a transition metal such as tungsten, Step 704: oxidize the metal surface using an oxidizing gas, for example oxygen, to form a metal oxide layer in a rapid thermal oxidation (RTO) process in a reaction chamber at a temperature ranging from about 470 degrees Celsius to about 800 degrees Celsius and a pressure ranging from about 100 torr to 1000 torr. In certain embodiments, the reaction temperature can range from about 470 degrees Celsius to about 480 degrees Celsius and the pressure is at atmospheric pressure.

Step 706: form a nitrogen-containing metal oxide over the metal oxide by exposing the metal oxide to a reaction gas mixture comprising at least nitrogen gas in the same reaction chamber. In certain embodiments, the reaction gas mixture includes nitrogen and a continuing flow of oxygen from the RTO process. Reaction temperature and pressure can be about the same as the RTO process.

Step 708: form a top electrode over at least the nitrided metal oxide surface. The top electrode can be a metal material including a diffusion barrier layer. Alternatively, the top electrode can be a polysilicon material (p+ doped or n+ doped) without the diffusion barrier layer.

The nitrogen-containing metal oxide can be made using processes that yield a more flat metal oxide surface, than metal oxide memory materials made without nitrogenation. The more flat surface facilitates subsequent processing steps to improve device yield and performance.

Additionally, the resistive memory device having a nitrogen-containing metal oxide memory element can use a lower forming voltage than a resistive memory device having only metal oxide as the memory element. It is found also that the device can be operated under lower SET and RESET voltages.

A memory device is exemplified using a metal oxide memory element. The memory device includes a bottom electrode and a top electrode. The bottom electrode can be disposed in a plug structure lined with a diffusion barrier layer, and can comprise a transition metal, such as tungsten. The top electrode can be a metal material, a metal nitride, a polysilicon, or combinations of materials. A metal oxide memory element comprising nitrogen-containing metal oxide is disposed between the top electrode and the bottom electrode. The metal oxide can be formed by thermal oxidation of the bottom electrode, and the nitrogen-containing metal oxide can be formed by exposing the metal oxide to a reaction gas comprising at least nitrogen.

Figure 8:
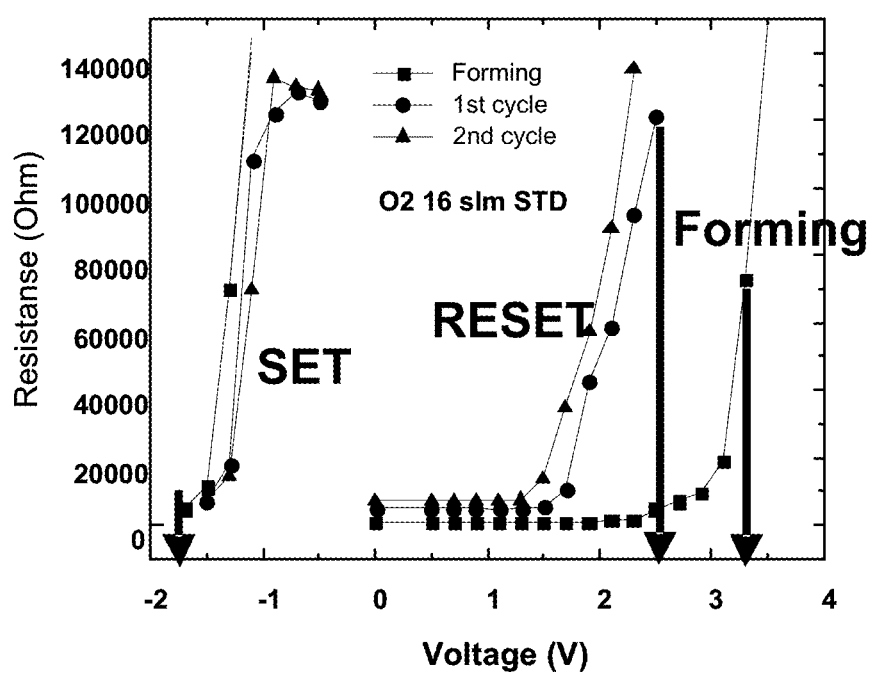
FIG. 8 is a plot of resistance as a function of voltage (RV plots) for metal oxide memory cells made without nitrogenation.

FIG. 8 illustrates an electrical characteristic by way of a resistance versus voltage (RV) plot of RRAM memory device 100 having tungsten oxide as the memory material as in FIG. 1. The memory device is formed using thermal oxidation of a tungsten electrode at about 500 degrees Celsius. The memory device has a forming voltage of about +3.3 volts, a set voltage of about −1.8 volts, and a reset voltage of about +2.5 volts.

Figure 9:
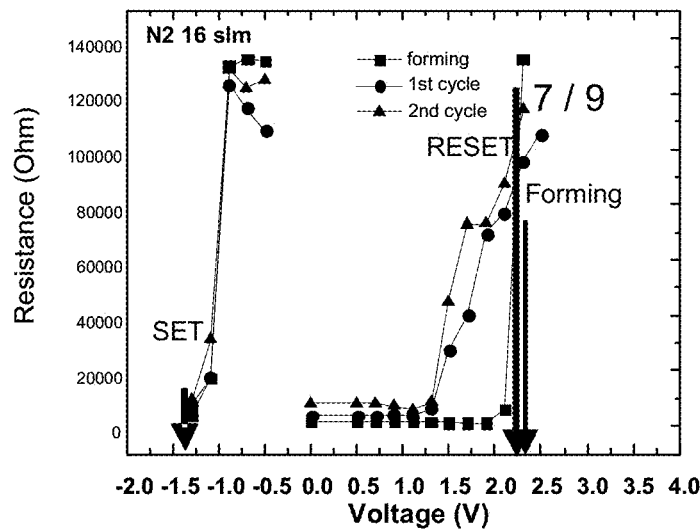
FIGS. 9-12 are plots of resistance as a function of voltage (RV plots) for metal oxide memory cells made with different nitrogenation conditions.
Figure 10:
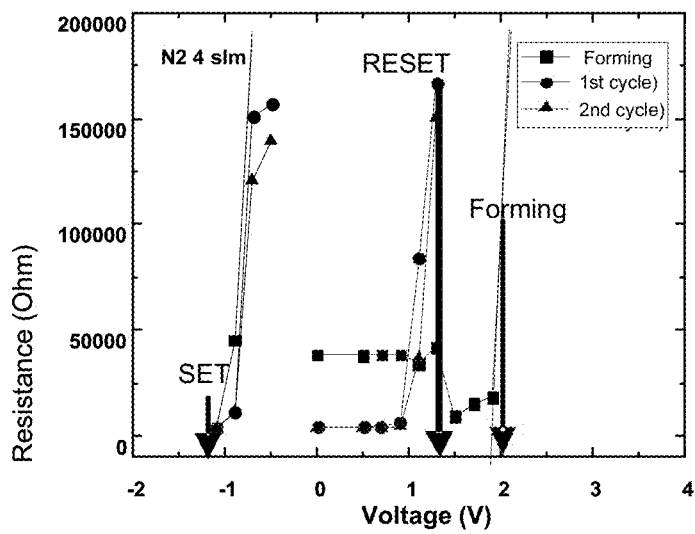
Figure 11:
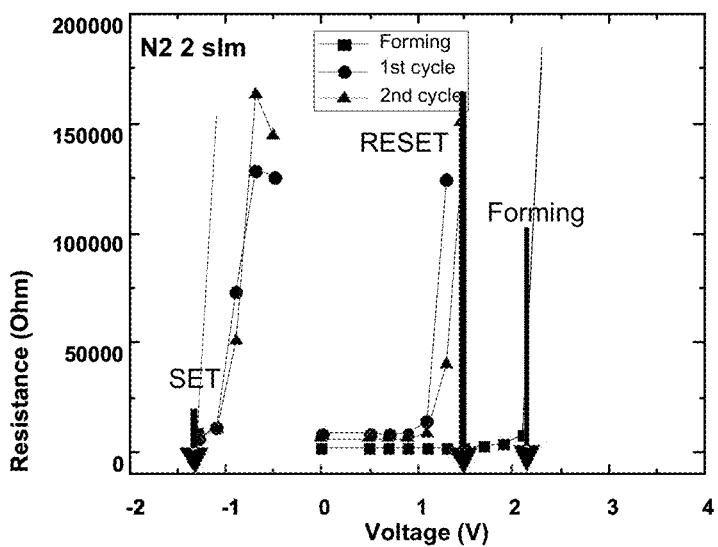

FIGS. 9-11 illustrate RV plots of RRAM memory devices having a nitrogen-containing tungsten oxide over tungsten oxide as the memory element as in FIG. 6. The memory devices are fabricated using the following process condition:
Process pressure: at atmospheric pressure.
Temperature profile for the rapid thermal process:
Temperature ramp up at about 10 degrees Celsius per second
Hold temperature: at about 500 degrees Celsius
Oxygen flow rate: at about 16 slm for both oxidation step and nitrogenation step
Nitrogen flow rate for nitrogenation step:
About 16 slm for the device of FIG. 9,
About 4 slm for the device of FIG. 10, and
About 2 slm for the device of FIG. 11.

As illustrated in RV plots in FIG. 9-11, devices having a nitrogen-containing tungsten oxide over tungsten oxide as the memory element each have a forming voltage lower than the device having only tungsten oxide as the memory element. For example, the device of FIG. 9 has a forming voltage of about +2.2 volts. The device of FIG. 10 has a forming voltage of about 2 volts. The device of FIG. 11 has a forming voltage of about 2.1 volts. The forming voltage is about the same (about 2.0 volts) for the devices having different nitrogen flow rates.

The SET voltages for devices in FIG. 9-11 are in general having a magnitude lower than the SET voltage for the device having tungsten oxide as the memory element. The device of FIG. 9 has a SET voltage of about −1.3 volts. The device of FIG. 10 has a SET voltage of about −1.1 volts. The device of FIG. 11 has a SET voltage of about −1.3 volts.

The RESET voltages for the devices of FIGS. 9-11 can vary but, in general, have a magnitude lower than the RESET voltage for the device having only tungsten oxide as the memory element. The device of FIG. 9 has a RESET voltage of about +2.2 volts. The device of FIG. 10 has a RESET voltage of about +1.4 volts. The device of FIG. 11 has a RESET voltage of about +1.5 volts.

Figure 12:
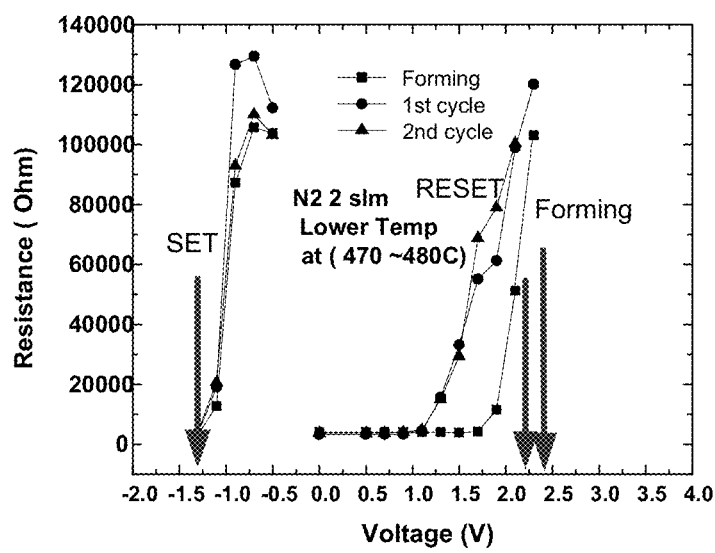

FIG. 12 illustrates an RV plot of a memory device having a nitrogen-containing tungsten oxide over tungsten oxide as the memory element as in FIG. 6. The difference between this device and those in FIGS. 9-11 is a lower hold temperature of about 470 degrees Celsius to about 480 degrees Celsius in the oxidation and the nitrogenation processes. As shown, the operating voltages (forming, set, reset) are about the same as those in FIGS. 9-11. Therefore, memory devices having nitrogen-containing tungsten oxide over tungsten oxide as a memory element can be fabricated at a lower temperature (470-480 degrees Celsius) and have similar performance (for example, forming voltage, SET voltage, and RESET voltage) as those formed at higher temperatures (about 500 degrees Celsius).

Figure 13:
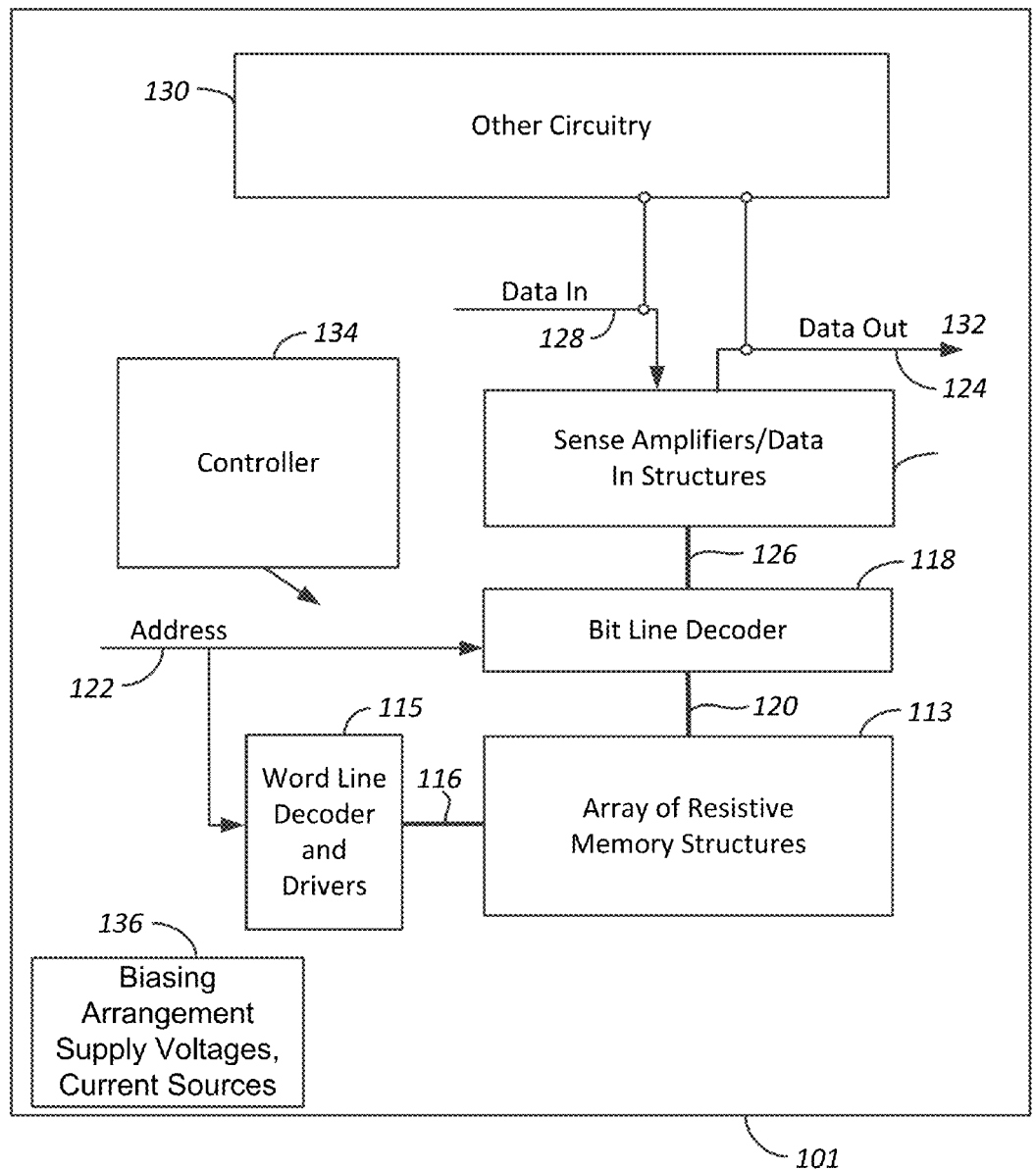
FIG. 13 is a simplified block diagram of an integrated circuit including the resistive memory structures.

FIG. 13 is a simplified block diagram of an integrated circuit 101 including a memory array 113 implemented using nitrogenized metal oxide resistive memory structure 600 as in FIG. 6. A word line decoder 115 having read, set and reset modes is coupled to and in electrical communication with a plurality of word lines 116 arranged along rows in the memory array 113. A bit line (column) decoder 118 is in electrical communication with a plurality of bit lines 120 arranged along columns in the array 113 for reading, setting, and resetting memory element 26 in array 113. Addresses are supplied on bus 122 to word line decoder and drivers 115 and bit line decoder 118. Sense amplifiers and data-in structures in block 124, including voltage and/or current sources for the read, set, and reset modes are coupled to bit line decoder 118 via data bus 126. Data is supplied via a data-in line 128 from input/output ports on integrated circuit 101, or from other data sources internal or external to integrated circuit 101, to data-in structures in block 124. Other circuitry 130 may be included on integrated circuit 101, such as a general purpose processor or special purpose application circuitry, or a combination of modules providing system-on-a-chip functionality supported by array 113. Data is supplied via a data-out line 132 from the sense amplifiers in block 124 to input/output ports on integrated circuit 101, or to other data destinations internal or external to integrated circuit 101.

A controller 134 implemented in this example, using a bias arrangement state machine, controls the application of bias arrangement supply voltages and current sources 136, such as read, program, erase, erase verify and program verify voltages and/or currents. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

The invention claimed is:

1. A method of forming a memory device, comprising:
providing a bottom electrode on a substrate;
forming a memory layer on the bottom electrode including a first layer of metal oxide and a second layer including a nitrogen-containing metal oxide;
forming a top electrode over and directly contacting the nitrogen-containing metal oxide; and
providing a controller including circuits to apply bias arrangements to the top electrode and the bottom electrode to change resistance of the memory layer in program operations.

2. The method of claim 1, wherein the bottom electrode comprises a transition metal and the nitrogen-containing metal oxide comprises an oxynitride of the transition metal.

3. The method of claim 1, wherein the nitrogen-containing metal oxide is formed by thermal oxidation in a nitrogen-containing chamber.

4. The method of claim 1, wherein the bottom electrode comprises a metal having a metal surface, and includes forming the memory layer by oxidizing the metal surface to form a metal oxide over the metal, and exposing the metal oxide to a reaction gas comprising nitrogen to form the nitrogen-containing metal oxide.

5. The method of claim 4, wherein the metal oxide is formed by thermal oxidation of the metal surface.

6. The method of claim 5, said thermal oxidation including a first rapid thermal process using oxygen in a reaction chamber.

7. The method of claim 6, wherein exposing the metal oxide to a reaction gas comprising nitrogen includes a second rapid thermal process, the second rapid thermal process continuing from a temperature hold step of the first rapid thermal process in the reaction chamber using oxygen and nitrogen as the reaction gas to form said nitrogen-containing metal oxide.

8. The method of claim 7, the first rapid thermal process and the second rapid thermal process each including a reaction hold temperature ranging from about 470 degrees Celsius to about 800 degrees Celsius.

9. The method of claim 1, wherein forming the bottom electrode includes:
providing an insulating material;
forming an opening in the insulator material;
lining the opening with a diffusion barrier layer;
depositing the metal over the diffusion barrier in the opening for a bottom electrode.

10. A resistive memory device, comprising:
a bottom electrode on a substrate;
a memory layer on the bottom electrode including a first layer of metal oxide and a second layer including a nitrogen-containing metal oxide;
a top electrode over and directly contacting the second layer; and
a controller including circuits to apply bias arrangements to the top electrode and the bottom electrode to change resistance of the memory layer in program operations.

11. The device of claim 10, wherein the bottom electrode comprises a transition metal and the nitrogen containing metal oxide comprises an oxynitride of the transition metal.

12. The device of claim 11, wherein the transition metal is tungsten.

13. The device of claim 10, wherein the first layer of metal oxide includes tungsten oxide, and the second layer includes tungsten oxynitride.

14. The device of claim 10 wherein the bottom electrode comprises a metal having a metal surface, and the metal oxide comprises an oxide of the metal at the metal surface.

15. A resistive memory device, comprising:
- a bottom electrode comprising a transition metal on a substrate;
- a memory layer on the bottom electrode including a layer of an oxide of the transition metal, and a layer of a nitrogen-containing oxide of the transition metal,
- a top electrode over and directly contacting the nitrogen-containing oxide of the transition metal; and
- a controller including circuits to apply bias arrangements to the top electrode and the bottom electrode to change resistance of the memory layer in program operations.

16. The device of claim 15, wherein the transition metal is tungsten.

17. The device of claim 10, further including a diffusion barrier surrounding and directly contacting the bottom electrode and the memory layer; and directly contacting the top electrode.

18. The device of claim 17, further comprising a conductive line under the bottom electrode and directly contacting the diffusion barrier layer.

19. The device of claim 10, wherein the top electrode includes a portion directly contacting the second layer and the top electrode consists of one of a metal material, a metal nitride, and a polysilicon material.

20. The device of claim 10, wherein the top electrode includes a portion directly contacting the second layer and the top electrode consists of one of titanium nitride, tungsten nitride, tantalum nitride, titanium, tungsten, copper, and aluminum.

* * * * *